(12) United States Patent
Brunner et al.

(10) Patent No.: US 7,876,244 B2
(45) Date of Patent: Jan. 25, 2011

(54) METHOD FOR ALIGNING A SERIAL BIT STREAM WITH A PARALLEL OUTPUT

(75) Inventors: Robert Brunner, Montreal (CA); David Gordon, Montreal (CA); Martin Julien, Laval (CA); Ludovic Beliveau, Montreal (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 12/475,250

(22) Filed: May 29, 2009

(65) Prior Publication Data
US 2010/0302079 A1 Dec. 2, 2010

(51) Int. Cl.
*H03M 9/00* (2006.01)
(52) U.S. Cl. ...................... 341/100; 714/718
(58) Field of Classification Search ......... 341/100–110; 714/718, 807
See application file for complete search history.

(56) References Cited

U.S. PATENT DOCUMENTS

| | | | |
|---|---|---|---|
| 6,151,268 A * | 11/2000 | Yoshikawa | 365/230.09 |
| 6,539,051 B1 | 3/2003 | Grivna | |
| 7,272,679 B2 * | 9/2007 | Taborek et al. | 710/305 |
| 7,336,666 B1 | 2/2008 | Grivna | |
| 7,373,454 B1 | 5/2008 | Noe | |
| 2003/0161351 A1 | 8/2003 | Beverly et al. | |
| 2003/0161429 A1 | 8/2003 | Chiang | |
| 2005/0259772 A1 | 11/2005 | Voutilainen | |
| 2008/0001794 A1 | 1/2008 | Kobayashi | |
| 2009/0172479 A1 * | 7/2009 | Jang et al. | 714/718 |
| 2010/0165759 A1 * | 7/2010 | Choi | 365/193 |

FOREIGN PATENT DOCUMENTS

| | | |
|---|---|---|
| WO | 96/42158 A1 | 12/1996 |
| WO | 97/42731 A1 | 11/1997 |
| WO | 01/78489 A2 | 10/2001 |
| WO | 02/069515 A1 | 9/2002 |
| WO | 2006/107412 A2 | 10/2006 |

OTHER PUBLICATIONS

Shastri, Bhavin J. et al.: "Burst-Mode Clock and Data Recovery with FEC and Fast Phase Acquisition for Burst-Error Correction in GPONs"; Department of Electrical and Computer Engineering, Photonic Systems Group, McGill University, Montreal, Canada, 2007 (pp. 120-123).
International Search Report for PCT/IB2010/052376 dated Sep. 29, 2010; 7 pages.

* cited by examiner

*Primary Examiner*—Lam T Mai
(74) *Attorney, Agent, or Firm*—Alex Nicolaescu; Ericsson Canada Inc.

(57) ABSTRACT

The invention relates to a method and circuit for aligning a serial bit stream with a parallel output. The method comprises latching Q bits from the serial bit stream into a register, locating a position P of a first bit of a start of frame delimiter (SFD) in the register and discarding P-1 bits from the serial bit stream, before the position of the first bit of the SFD, thereby aligning the serial bit stream with the parallel output. The circuit comprises a latch, a fault tolerant analysis logic (FTAL) for locating a position P of a first bit of a start of frame delimiter (SFD) in the register and a shift register for discarding P-1 bits from the serial bit stream, before the position of the first bit of the SFD, thereby aligning the serial bit stream with the parallel output.

12 Claims, 7 Drawing Sheets

|  | No bit shifting | 4 bit shifting |
|---|---|---|
| First 16 bit latch | Bits 0 to 15 | Bits 4 to 19 |
| Second 16 bit latch | Bits 16 to 31 | Bits 19 to 34 (shift) |
| Third 16 bit latch | Bits 32 to 47 | Bits 34 to 49 (shift) |
| Fourth 16 bit latch | Bits 48 to 63 | Bits 49 to 64 (shift) |
| Fifth 16 bit latch | Bits 64 to 79 | Bits 64 to 79 (shift) |
| Sixth 16 bit latch | Bits 80 to 95 | Bits 80 to 95 |

FIG. 2

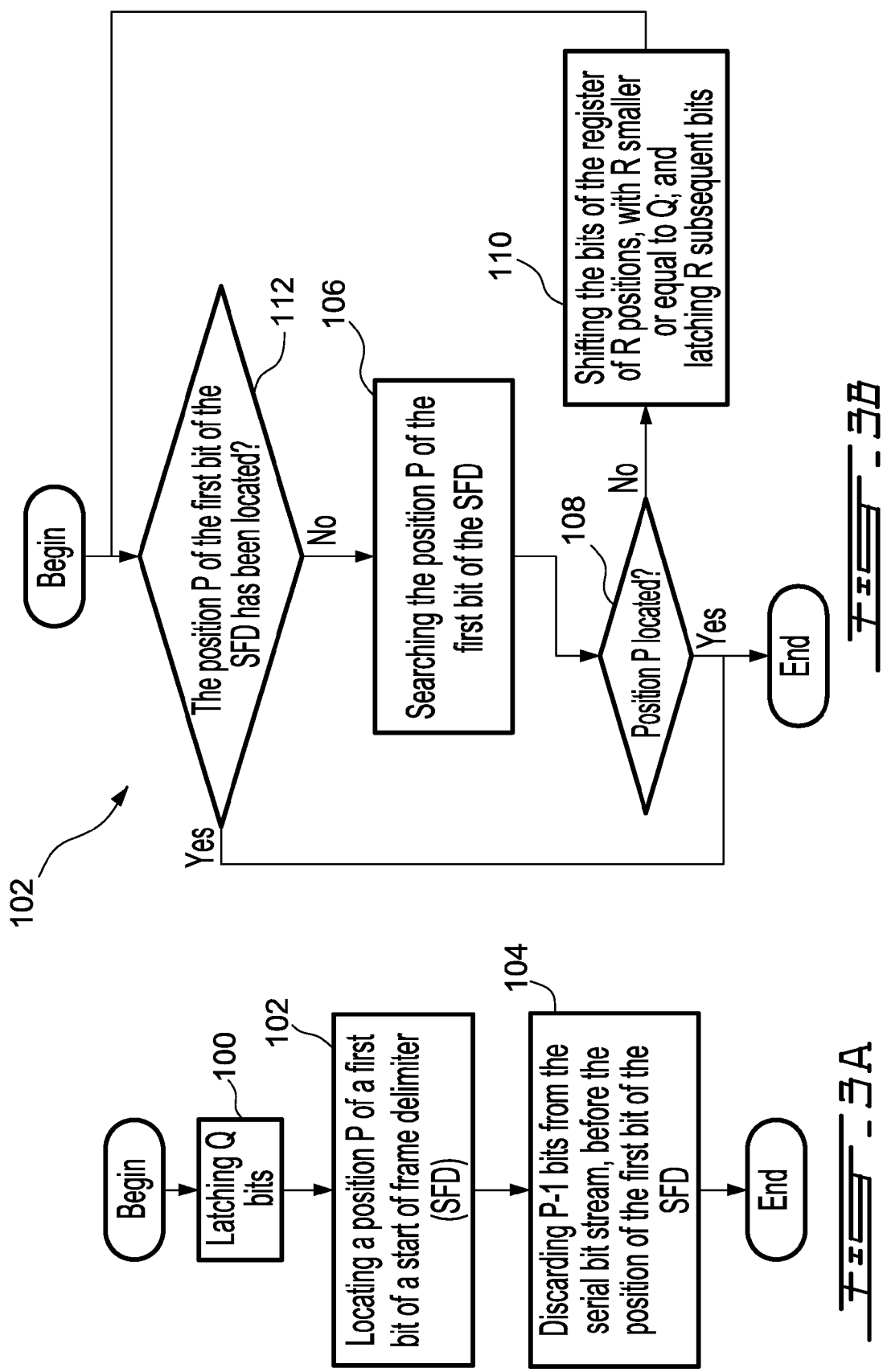

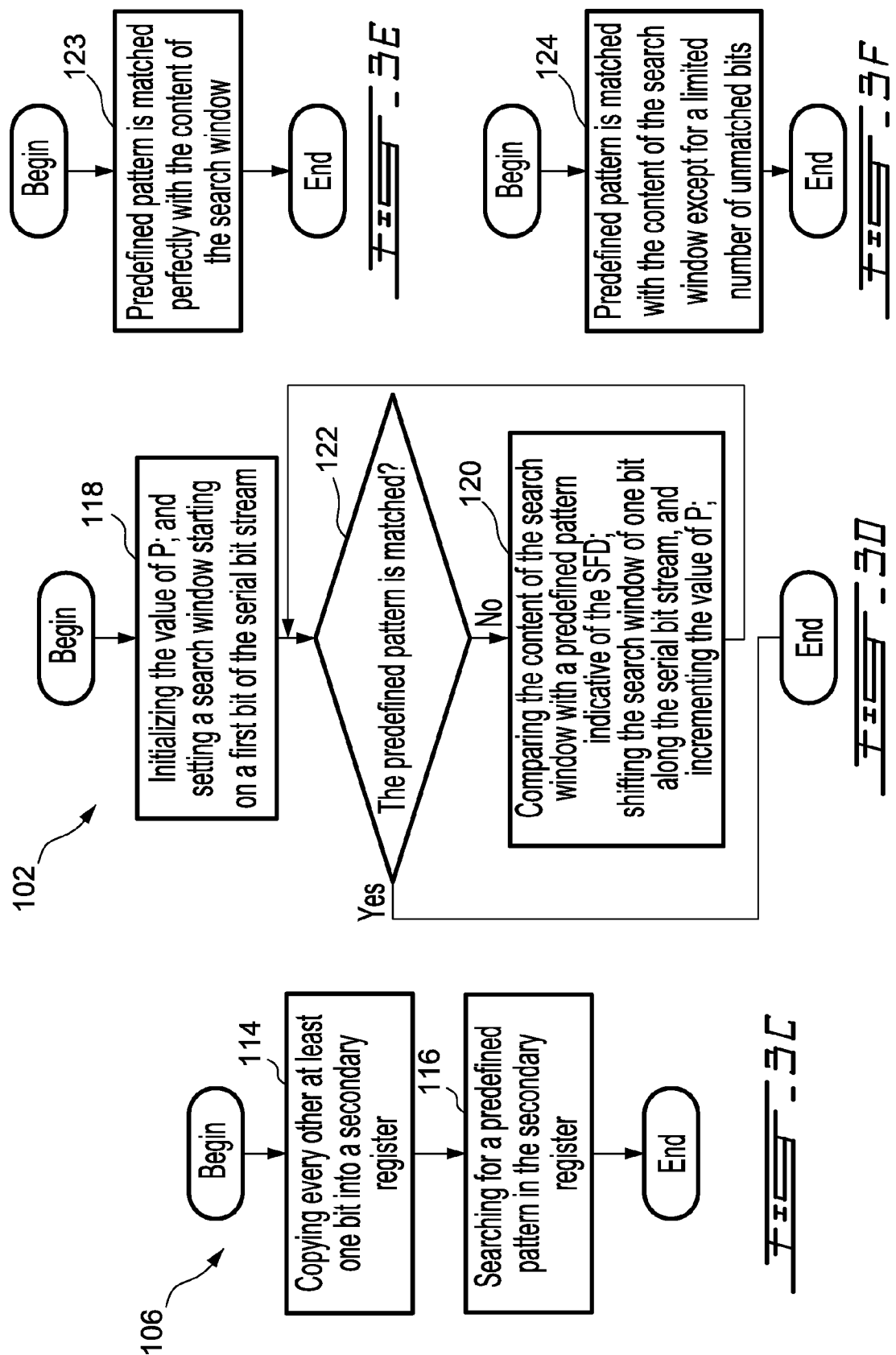

RULES TABLE:
1) If ((UU_Position != NULL) && (LL_Position == NULL)) then Bits-to-Discard=UU_Position;
2) If ((LL_Position != NULL) && (UU_Position == NULL)) then Bits-to-Discard=LL_Position-2;
3) If (UU_Position == (LL_Position-2)) then Bits-to-Discard=UU_Position;
4) If (UU_Position < (LL_Position-2)) then Bits-to-Discard=LL_Position-2;
5) If (LL_Position < (UU_Position) then Bits-to-Discard=UU_Position;

FIG. 6

METHOD FOR ALIGNING A SERIAL BIT STREAM WITH A PARALLEL OUTPUT

TECHNICAL FIELD

The present invention relates to serializer and deserializer and more particularly to a method for aligning a serial bit stream with a parallel output.

BACKGROUND

A serializer/deserializer is a pair of functional blocks commonly used in high speed communications. These blocks convert data between serial and parallel data interfaces in each direction. A generic serializer converts parallel data to serial data, while a generic deserializer (DESERDES) converts serial data to parallel data.

Serial data is often transmitted in frames, which are prefixed by a set of bits called a preamble. For example, in Ethernet, the preamble consists of 8 bytes, the last of which has a special sequence known as the Start of Frame Delimiter (SFD), which indicates that actual information follows. The purpose of the preamble is to allow bit locking with a Digital Phase Lock Loop (DPLL), which is used to synchronize an embedded serial data clock, embedded in the preamble, to a transmit data clock. The embedded serial data clock may be recovered from the data stream using a clock recovery technique. Thereafter, the embedded serial data clock may be divided down to the parallel rate. To acquire lock, the DPLL usually needs to receive bits at the start of each frame.

However, when the first bit of the preamble is received, the transmit data clock may not be in phase with the embedded serial data clock of the data stream. In this case, during the course of the preamble, the DPLL can learn the correct phase and can synchronize both clocks. In this process, however, the DPLL may miss or gain a number of bits. A special pattern is therefore generally used to mark the last two bits of the preamble. When this special pattern is received, the receiving interface starts collecting the bits of actual information into bytes for processing.

Two exemplary problems that may affect a DESERDES during bit locking are bit shifting and bit corruption. When bit shifting occurs, the bit stream is shifted left or right by one or more bits. This means that the bit stream is intact, but the DESERDES is reading in all values shifted by one or more bits. Consequently, the preamble is not recognized and the whole frame is lost.

When bit corruption occurs, one or more bits contain the wrong value. If corruption occurs in the body of a frame, usually, checksum or error correction can recover the original value. However, if corruption occurs in the preamble, the DESERDES is unable to lock onto the preamble and loses the whole frame.

SUMMARY

It is therefore an object of this invention to provide a method and device for overcoming at least some of the prior art drawbacks.

According to an aspect of the invention, a method for aligning a serial bit stream with a parallel output is provided. The method comprises latching Q bits from the serial bit stream into a register. The method further comprises locating a position P of a first bit of a start of frame delimiter (SFD) in the register. And the method comprises discarding P-1 bits from the serial bit stream, before the position of the first bit of the SFD, thereby aligning the serial bit stream with the parallel output.

According to an other aspect of the invention, a circuit for aligning a serial bit stream with a parallel output is provided. The circuit comprises a latch for latching Q bits from the serial bit stream into a register. The circuit also comprises a fault tolerant analysis logic (FTAL) for locating a position P of a first bit of a start of frame delimiter (SFD) in the register. And the circuit comprises a shift register for discarding P-1 bits from the serial bit stream, before the position of the first bit of the SFD, thereby aligning the serial bit stream with the parallel output.

BRIEF DESCRIPTION OF THE DRAWINGS

The objects and advantages of the invention will be understood by reading the detailed description in conjunction with the figures, wherein:

FIG. 2 is a table illustrating an exemplary process for shifting 4 bits of a bit stream;

FIG. 3a-f are flowcharts of exemplary methods according to the invention;

FIG. 6 is a table illustrating exemplary rules used for locating the position of a start of frame delimiter in a corrupted bit stream.

DETAILED DESCRIPTION

The various features of the invention will now be described with reference to the figures. These various aspects are described hereafter in greater detail in connection with exemplary embodiments and examples to facilitate an understanding of the invention, but should not be construed as limited to these embodiments. Rather, these embodiments are provided so that the disclosure will be thorough and complete, and will fully convey the scope of the invention to those skilled in the art.

Many aspects of the invention are described in terms of sequences of actions or functions to be performed by elements of a computer system or other hardware capable of executing programmed instructions. It will be recognized that the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention.

The embodiments according to the present invention are described with reference to block diagrams and/or operational illustrations of methods, servers, and computer program products. It is to be understood that each block of the block diagrams and/or operational illustrations, and combinations of blocks in the block diagrams and/or operational illustrations, can be implemented by radio frequency, analog and/or digital hardware, and/or computer program instructions. These computer program instructions may be provided to a processor circuit of a general purpose computer, special purpose computer, ASIC, and/or other programmable data processing apparatus, such that the instructions, which execute via the processor of the computer and/or other programmable data processing apparatus, create means for implementing the functions/acts specified in the block diagrams and/or operational block or blocks. In some alternate implementations, the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Figure 1:
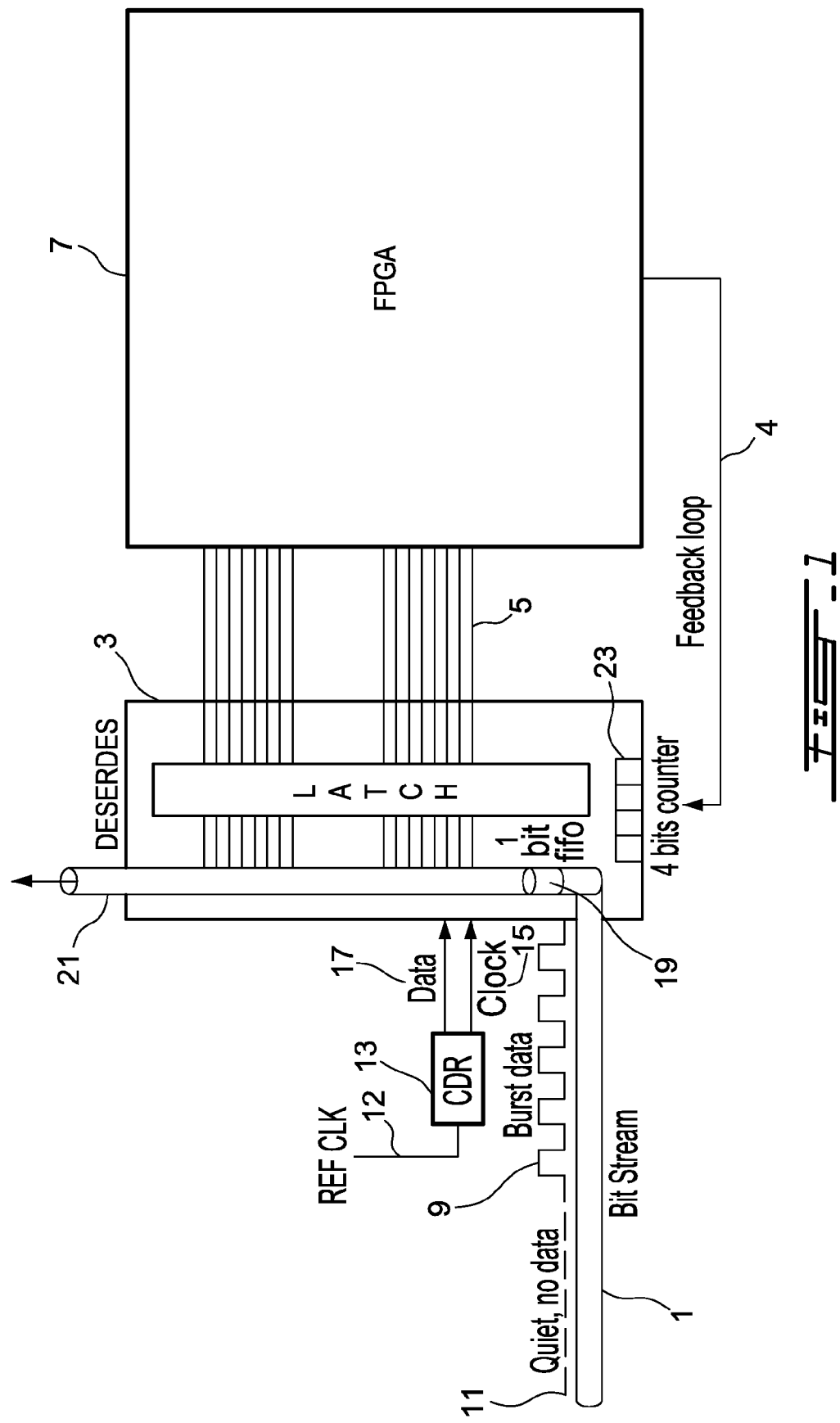
FIG. 1 is a schematic drawing of an exemplary embodiment of a deserializer.

FIG. 1 illustrates a high level view of a bit stream 1 entering a DESERDES 3. In this exemplary embodiment of DESERDES, the bit stream 1 is sent to a parallel bus 5 that connects to a Field-Programmable Gate Array (FPGA) 7. The bit stream 1 is characterized by data arriving in bursts 9. As illustrated, there may be a quiet period 11 with no data and then a burst 9 of data may arrive. The Clock and Data Recovery (CDR) component 13, is responsible for extracting the embedded serial clock and the data 17 from the bit stream 1. Subsequently, if there is no data, such as during a quiet period 11, the CDR 13 may generate a clock 15 signal derived from a reference clock 12 (REF CLK) provided to the CDR 13 and a data 17 signal fixed at logic level "0".

When a burst of data 9 is received by the CDR 13, the embedded serial clock is recovered and phase-locking to the REF CLK 12 is executed. A lock signal may be asserted (set to a high, "true" or "1" logical level) from the CDR 13 to a Z bits counter 23, in this case Z being equal to 4 and thereafter, indicating the start of valid output data 17. However, the valid output data, may not be aligned on the first data bit, thus giving rise to a bit shift.

The DESERDES 3 of FIG. 1 has a 16 bit parallel bus 5. As the bit stream enters the DESERDES, each bit 19 passes through a 1-bit First In First Out (FIFO) 21. Associated to the FIFO is a 4 bit binary counter 23 that counts up to 16 and then triggers a latch. When the latch is triggered, 16 bits are sent on the parallel bus to the FPGA 7. Once the FPGA receives the 16 bits, it first looks for a preamble. Preambles may be of varying length, as can be the parallel bus. For example, for a Gigabit Passive Optical Network (GPON) system, the preamble may be 96 bits long for 1.244 Gbps up to 192 bits long for 2.488 Gbps. Therefore, the FPGA 7 should preferably be capable of recognizing a preamble pattern separated over a number of 16 bits transmissions or any other number of bits, depending on the size of the parallel bus.

In order to implement a fault tolerant bit locking mechanism for DESERDES, the data bits may be analyzed in order to recognize a preamble that has been affected by bit shifting or bit corruption. In an exemplary embodiment, the analysis may be performed externally to the DESERDES 3 in a FPGA 7. When the FPGA 7 detects a bit shift, it can inform the DESERDES 3 through the feedback loop 4 to compensate by shifting in the opposite direction. Also, the FPGA 7 may recognize a preamble that has been affected by bit corruption and may correct the preamble without automatically discarding the frame. In an alternate embodiment, the FPGA could be an integral part of the DESERDES as readily apparent to a person skilled in the art.

To provide an illustration, an exemplary embodiment of the invention will consider a GPON system. The serial input may come from an optical fiber, whereas a parallel bus on the other side of the DESERDES may be connected to an FPGA that implements the GPON medium access control. In this exemplary embodiment, a transmission may start with an 8 byte (64 bit) preamble sequence. This preamble may consist of 62 alternating 1's and 0's followed by the pattern "11". The last byte which finishes with the '11' is known as the Start of Frame Delimiter (SFD). For instance, when encoded using Manchester encoding, at 10 Mbps, the 62 alternating bits produce a 5 MHz square wave, giving the embedded serial clock. Manchester encoding is known by a person skilled in the art and is not within the scope of this invention.

In the exemplary embodiment of FIG. 1, the detection of the preamble in the FPGA 7 is improved by accounting for corrupted bits. For example, if one bit is corrupted, the FPGA 7 may still assume with relative certainty that the preamble pattern has been detected using a rule of FIG. 6 or any other suitable rule, as it would be apparent to a person skilled in the art. Additionally, corruption in the preamble should not affect checksums or error correction in the body of the frame as they usually do not include the preamble. However, if the preamble is included in a checksum, the correction of the checksum may still be performed.

In the case of a bit shift, the FPGA 7 of the exemplary embodiment of FIG. 1 may detect the preamble pattern, but with a shift. Once detected, the FPGA 7, through a feedback loop 4, may inform the DESERDES to compensate for the shift. This can be done with a mechanism by which the FPGA can instruct the DESERDES 3 to shift by 1 bit every 16 bits. This implies that 1 bit may be lost, or repeated, during each shift. In such an implementation, for example, a 1.244 Gbps GPON preamble (96 bits) may be received shifted by 4 bits. Initially, 4 bits may be lost and the FPGA may receive the bits 4 to 19. The FPGA 7 may then detect that the preamble is shifted and instruct the DESERDES 3 to shift by 1 bit four times, to realign the bits properly. The table of FIG. 2 illustrates the process of shifting 4 bits compared to a regular scenario where no bit shifting is necessary. In this example, the sequence of bits is shifted by one bit at every latch, thus resending the last bit of the previous latch as the first fit of the current latch. Since the first four bits were lost in an initial 4-bit shift, bits 19, 34, 49, and 64 are repeated to re-align the DESERDES 3. The opposite could happen where the first four bits would be garbage and the FPGA 7 would actually receive bits −4 to 11. In that case, the reverse could be applied and then bits would be skipped rather than repeated at each shift.

As described above and illustrated in FIGS. 3 a-f, the present invention provides a method for aligning a serial bit stream with a parallel output. The first step of the method consists of latching Q bits from the serial bit stream into a register, step 100. In the exemplary embodiment provided above, Q equalled 16. However, Q may be any suitable number, preferably corresponding to the length of a registry or of a memory slot or other equivalent hardware device. The second step consists of locating a position P of a first bit of a start of frame delimiter (SFD) in the register, step 102. Once this position P is located, it is possible to start shifting the sequence of bits in one direction or the other to align the bits with the parallel output. This is done by discarding P-1 bits from the serial bit stream, before the position of the first bit of the SFD, thereby aligning the serial bit stream with the parallel output, step 104. In the embodiment described before, the shift was done one bit at a time. However, it is possible to have embodiments able to shift many bits at a time, such as a DESERDES implemented in an FPGA or Application-Specific Integrated Circuit (ASIC), where a W-bits shift could be specified in the feedback loop.

The step of locating 102 may be executed by iteratively performing the following steps. Firstly, searching the position P of the first bit of the SFD in the register, step 106. Secondly, if the position P is not located 108, shifting the bits of the register of R positions, therefore discarding R bits, with R smaller or equal to Q and latching R subsequent bits of the serial data stream into the register, step 110. These steps may be executed until the position P of the first bit of the SFD has been located or the serial bit stream has all been processed, step 112.

The step of searching 106 described above may be executed by copying every other at least one bit of the register into a secondary register, step 114 and searching for a predefined pattern in the secondary register, for identifying the position P of the first bit of the SFD, step 116. The pattern would be generated by a subset of the SFD copied in the secondary register.

In another embodiment, the step of locating 102 may be executed with the following steps. Initializing the value of P and setting a search window starting on a first bit of the serial bit stream, step 118. Iteratively performing the steps of comparing the content of the search window with a predefined pattern indicative of the SFD, shifting the search window of at least one bit along the serial bit stream and incrementing accordingly the value of P step 120, until the predefined pattern is matched 122. The method described above may be applied to the preamble of a GPON burst, where the SFD has the form of a repetitive pattern.

The step of comparing the content of the search window with a predefined pattern indicative of the SFD may further comprise matching perfectly the predefined pattern with the content of the search window 123 or matching the predefined pattern with the content of the search window except for a limited number of unmatched bits 124, which may vary according to the rules illustrated in FIG. 6. As stated before, additional rules could be used, as it would be apparent to a person skilled in the art.

A typical upstream GPON burst comprises a simple N-bit "010101 . . . " preamble pattern, followed by a 16-bit SFD delimiter, further followed by a GPON Transmission Convergence (GTC) frame. The GTC frame portion is scrambled and typically Forward Error Correction (FEC) encoded using a RS (239,16) schema which is well known in the art. Other encoding schemes could be used as it would be apparent to a person skilled in the art. Unlike Ethernet, GPON can employ a non-static preamble/delimiter which is negotiated between an Optical Network Unit (ONU) & Optical Network Termination (ONT) devices.

Figure 4:
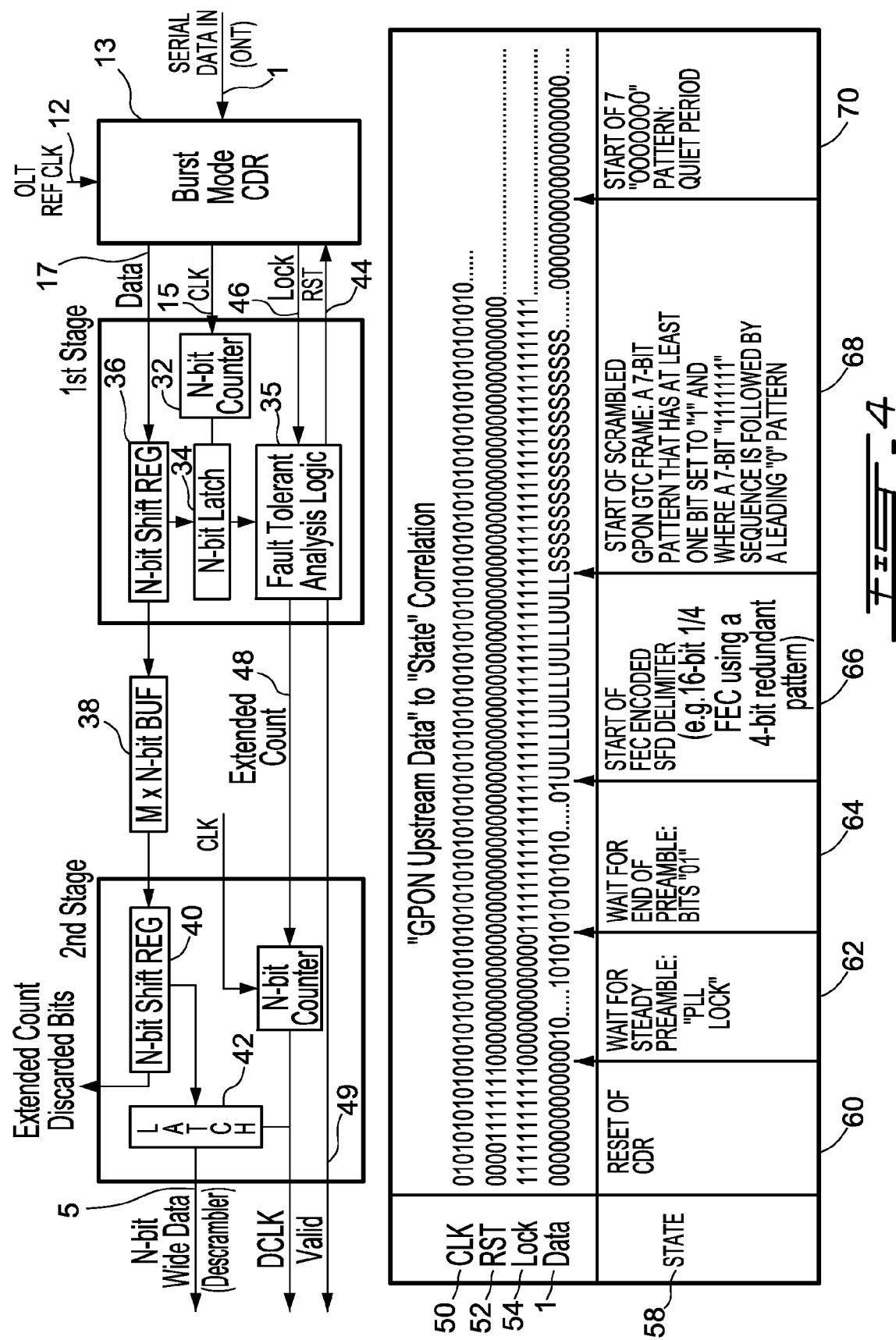
FIG. 4 is a schematic drawing of an exemplary embodiment of a deserializer according to the invention, further illustrating a bit stream, internal signals as well as different states of the deserializer.
Figure 5:
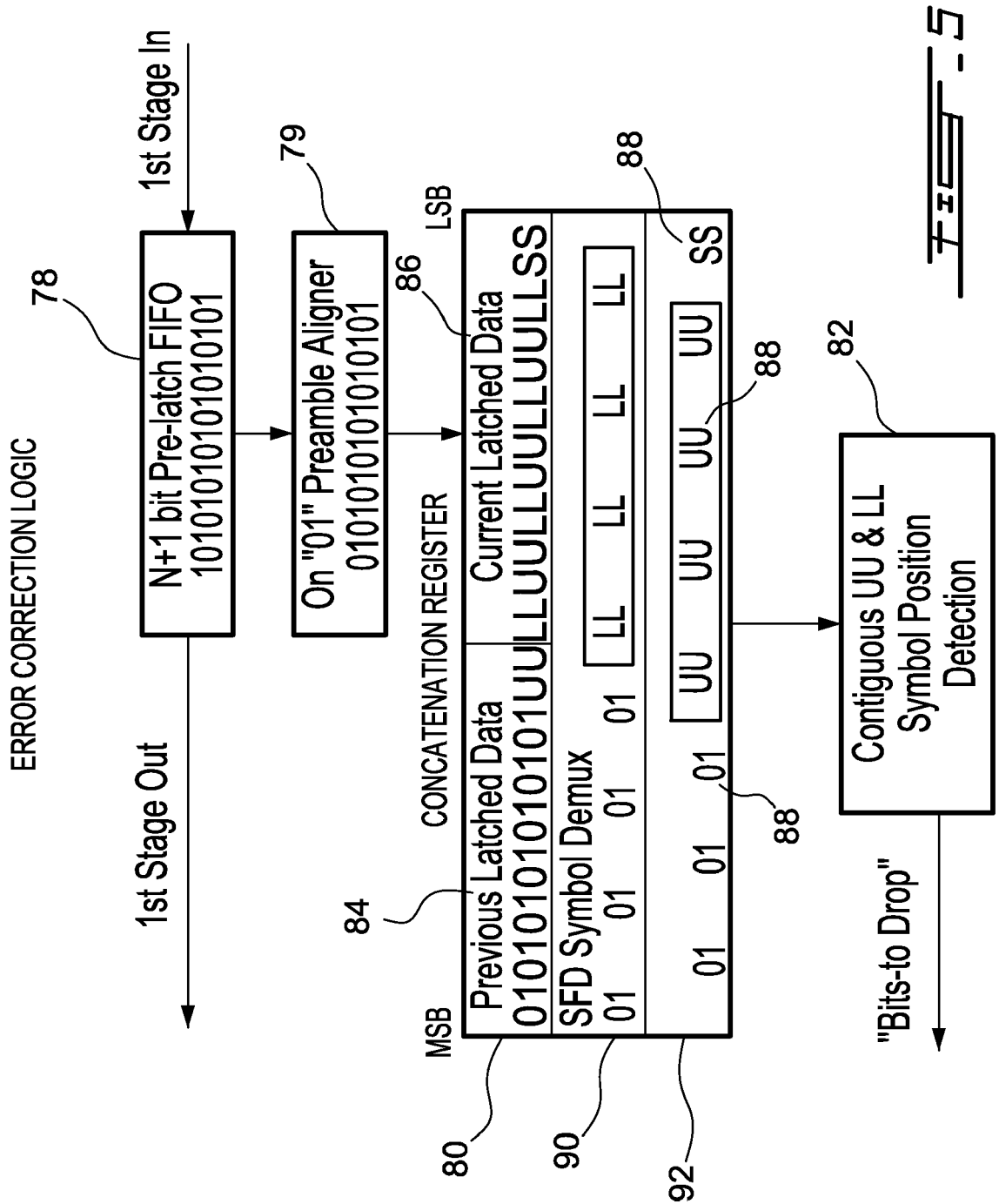
FIG. 5 is a schematic drawing of an exemplary embodiment of a circuit for locating the position of a start of frame delimiter.

FIGS. 4 and 5 illustrate exemplary components for the detection of the SFD delimiter, and thereby the start of an upstream (ONU to ONT) scrambled GTC frame in accordance with further exemplary embodiments of the present invention. These components may detect a preamble in a case where the starting bits are lost or shifted, or in a case where the preamble/delimiter is corrupted by a few bits in a window of 16-bits.

The top part of FIG. 4 shows an exemplary embodiment of a circuit for bits alignment, or bits locking, for GPON upstream bursts. As a person skilled in the art would understand it, the circuit shown may be made of a single physical component such as an ASIC, Application Specific Signal Processor (ASSP), FPGA, System On a Chip (SOC), multiple discrete components or any hardware or software equivalent. The core frequency of the silicon used determines the dimensioning of the various logic blocks as it should be understood by a person skilled in the art. This circuit comprises, from right to left, the serial data 1 entering the circuit and being fed to the CDR 13, which extracts the data 17 and embedded serial clock from the serial data 1. The circuit also comprises a N-bit counter 32 receiving the synchronized clock signal 15 and activating a latch 34, thereby feeding the fault tolerant analysis logic (FTAL) 35. The N-bit shift register 36 is used to buffer data 1 for the $1^{st}$ clock cycle, i.e. each latch of 34, of the FTAL 35 circuit. From the N-bit shift register 36, the data goes to a M×N bit buffer 38, which is used to buffer data for an additional clock cycle while the FTAL 35 circuit produces a result of M bits-to-discard. This value of M bits-to-discard in turn feeds another N-bit shift register 40. The value of M is dependent on the latency or delay of the FTAL 35 circuit, which in turn is dependent on the technology the FTAL 35 circuit is implemented on. The shift registers 36 and 40 in the $1^{st}/2^{nd}$/middle stages are usually 1-bit wide memories. This N-bit shift register 40 has for purpose to discard bits in order to align the serial bit stream to the parallel output through the latch 42. As mentioned earlier, some embodiments of the present invention support shifting of more than 1 bit at once.

The bottom part or FIG. 4 shows actual discrete signals processed by the components described above. The first row 50 shows the clock signal 15, the second row 52 shows a reset signal 44, the third row 54 shows the lock signal 46 and the fourth row 1 shows the actual data 17. The states in the last row 58 are related to the actual data 17. The different states will be described below.

FIG. 5 shows an exemplary embodiment of a circuit for locating the position of the SFD delimiter. This circuit is implemented in the first stage shown in FIG. 4 and more specifically in the FTAL 35 illustrated on FIG. 4.

Referring now concurrently to FIGS. 4 and 5, the present invention provides a circuit for aligning a serial bit stream 1 with a parallel output. The FTAL 35 may be used for locating a position P of a first bit of a start of frame delimiter (SFD). The circuit comprises the latch 34 for latching Q bits from the serial bit stream 1 into a register 78 of the FTAL 35. And the circuit comprises the shift register 40 for discarding P-1 bits from the serial bit stream, before the position of the first bit of the SFD, thereby aligning the serial bit stream with the parallel output.

The FTAL 35 of the circuit comprises a concatenation register 80 for holding a previous content of the register 79 and for receiving a current content of the register 79. The FTAL 35 also comprises one or more demultiplexed register 90, 92 for receiving every other at least one bit of the concatenation register 80. The FTAL 35 further comprises a position detection circuit 82 for searching for a predefined pattern in the demultiplexed register 90 or 92, for identifying the position P of the first bit of the SFD. The pattern is generated by a subset of the SFD is copied in the secondary register.

The position detection circuit 82 may identify the position P by perfectly matching the predefined pattern with the content of the search window or by matching the predefined pattern with the content of the search window except for a limited number of unmatched bits, which can vary according to the rules illustrated in FIG. 6.

In the exemplary embodiment illustrated in FIG. 4, the SFD delimiter chosen is a 1/X FEC 16-bit repetitive pattern, where X=4. Therefore it is a 16/4 bit pattern, which is repeated 4 times. This pattern has been chosen to easily differentiate the 4-bit-SFD (UULL) from the selected preamble pattern of "0101". However, this pattern could be UUULLL, UUUULLLL, or any other suitable combination. As a general rule, the UU & LL bits are chosen to be different from the "0101" of the preamble. Furthermore, the UU & LL bits are chosen so that UU is not equal to LL, for example, UULL may be "0011".

The first state, shown in box 60 of the state row in FIG. 4, is the state reset of CDR 13. The data corresponding to this state is data representing the quiet mode, as also shown in the data stream 1 in FIGS. 1 and 4. In the first state, box 60, the Fault Tolerant Analysis Logic (FTAL) 35 waits for a predetermined time, from startup, while only consecutive "0" are being received at the $1^{st}$ stage latch 34. Receiving subsequent "0" indicates a quiet period. When a certain number, Y-count, of "00000 . . . " has been received, the FTAL 35 transitions to the state CDR reset, still identified as box 60. In the state CDR reset (RST), the FTAL 35 asserts the CDR RST signal 44 for T-clock cycles. The CDR lock signal 46 gets set, when the CDR 13 has recovered a clock for an incoming preamble stream ("01010101 . . . ") and has been able to phase lock the embedded serial data clock to a REF CLK 11. The lock signal 46 typically remains asserted even if the incoming bit stream is lost. Then, the CDR RST signal 44 is de-asserted (set to a low, "false" or "0" logical level). The FTAL 35 then transitions to the state Waiting for PLL Lock 62, shown in box 62.

In box 62, data corresponding to the preamble begins to be transmitted and the embedded clock signal is readily apparent in it. The state corresponding to box 62 is waiting for PLL lock. In this state, the FTAL 35 awaits for the CDR lock signal 46, which indicates that a stream of " . . . 10101010 . . . " has become available to the $1^{st}$ stage latch 34. In the event the CDR lock signal 46 has been asserted, the $1^{st}$ stage latch 34 aligns on a "0101 . . . " pattern, with the preamble aligned as illustrate on FIG. 5, and the FTAL 35 transitions to the state waiting for SFD delimiter, box 64.

In box 64, the embedded clock signal is still received and the circuit is in a state where the end of the preamble is awaited, this is the state waiting for SFD delimiter. In this state and in the next state: start of FEC encoded delimiter, box 66, the FTAL 35 locates the position of the SFD delimiter within an aligned "01010101 . . . " preamble pattern. In box 66, the start of frame delimiter, which is a pattern that the circuit is looking for, is actually detected in order to locate where the scrambled GPON frame starts.

The working of the FTAL 35 will now be described in more details, in view of FIG. 5. The incoming data stream 1 is firstly aligned on a "01" preamble pattern, as opposed to a "10" pattern, with a preamble aligner 79. A 32-bit concatenation register 80 contains 16-bits of previously latched data 84 and 16-bits of currently latched data 86. The 32-bit content is multiplexed into interleaved symbols 88 of 2-bits. This is shown by elements 90 and 92, which are SFD demux registers containing demultiplexed signals. This allows the search for the SFD as an 8-bit contiguous pattern of UU-UU-UU-UU or LL-LL-LL-LL where U="0", and L="1", for example.

In the exemplary embodiment of FIG. 5, the relative position from the Most Significant Bit (MSB) of the concatenation register 80 to the beginning of the SFD "UULL" delimiter is fourteen bits. This relative position P is applied to the pseudo-register called bits-to-drop 82. Therefore, in the sequence " . . . 010101UULLUULL . . . " a value of "14" is applied to the bits-to-drop register 83. The bits-to-drop register then signals to the $2^{nd}$ stage latch 42 of FIG. 4 via the extended count signal 48 for a discarding of 14 bits. The extended count is a one-time event, discarding P-1 bits that are never latched in the $2^{nd}$ stage, resulting in the $2^{nd}$ stage DESERDES aligning with the MSB of the GTC frame.

In the case where the preamble bits are intermittently corrupted, the FTAL 35 may not generate a match on an 8-bit contiguous stream of UU-UU-UU-UU symbols, where U="0", or on an 8-bit contiguous stream of LL-LL-LL-LL symbols, where L="1". However, if enough Us or Ls remain, the position of the first U may still be located reliably using, for example, a position detection circuit 82. This defines the capacity of the FTAL 35 to locate the SFD even in case of bit corruption. For instance, a limited number of bits may be unmatched between the expected pattern and the content of the register 90 or 92 while still allowing the position P to be detected.

The position detection circuit may locate the position of reference of an 8-bit contiguous UU & LL pattern within the SFD demux registers 90 and 92 derived from the concatenation register 80. For example, if the registry 92 contains "UUUULUUUU" the position P can still be located reliably. Even more bit corruption may be tolerated and robustness may be added if both registries 90 and 92 are used in combination. The position of reference may then be adjusted based on a set of rules, defined to account for various single bit-errors. A non extensive rule table is shown in FIG. 6. This position of reference is used to locate the position of the SFD delimiter. The relative offset from the MSB of the concatenation register 80 to the start of the SFD delimiter is applied to the bits-to-drop register 83, which is signaled to the $2^{nd}$ stage latch 42, resulting in the locking or latching on the head of the GPON GTC frame.

The FTAL 35 then asserts the valid data signal 49 towards the $2^{nd}$ stage latch 42 section. This state corresponds to box 68 where the payload or actual data of the frame is deserialized. When the transmission of the frame is completed, there is a transition to the state waiting for quiet period, box 70. When the FTAL 35 latches all "0", the FTAL de-asserts the valid data signal 49, and then transitions to the state quiet period, box 70.

As it will be apparent to a person skilled in the art, what has been described in the exemplary embodiments may differ from other implementation of this invention. It should be appreciated that having a fault tolerant bit locking mechanism for DESERDES may provide for better communication mediums. Already, checksums and error correction have greatly increased the reliability of various mediums of communication. What has been proposed herein enhances further such mediums with respect to their regular working conditions.

The invention has been described with reference to particular embodiments. However, it will be readily apparent to those skilled in the art that it is possible to embody the invention in specific forms other than those of the embodiments described above. The described embodiments are merely illustrative and should not be considered restrictive in any way. The scope of the invention is given by the appended claims, rather than the preceding description, and all variations and equivalents that fall within the scope of the claims are intended to be embraced therein.

The invention claimed is:

1. A method for aligning a serial bit stream with a parallel output, comprising the steps of:
   latching Q bits from the serial bit stream into a register;
   locating a position P of a first bit of a start of frame delimiter (SFD) in the register; and
   discarding P-1 bits from the serial bit stream, before the position of the first bit of the SFD, thereby aligning the serial bit stream with the parallel output.

2. The method of claim 1, wherein the step of locating comprises:
   iteratively performing the following steps:
   i. searching the position P of the first bit of the SFD in the register; and ii. if the position P is not located
1. shifting the bits of the register of R positions, with R smaller or equal to Q; and
2. latching R subsequent bits of the serial data stream into the register;

until the position P of the first bit of the SFD has been located or the serial bit stream has all been processed.

3. The method of claim 2, wherein the step of searching comprises:
copying every other at least one bit of the register into a secondary register; and
searching for a predefined pattern in the secondary register, for identifying the position P of the first bit of the SFD, said pattern being generated by a subset of the SFD copied in the secondary register.

4. The method of claim 1, wherein the step of locating comprises:
initializing the value of P;
setting a search window starting on a first bit of the serial bit stream;
iteratively performing the following steps:
i. comparing the content of the search window with a predefined pattern indicative of the SFD;
ii. shifting the search window of at least one bit along the serial bit stream;
iii. incrementing the value of P according to the at least one bit shifting;
until the predefined pattern is matched.

5. The method of claim 4, wherein the steps i, ii and iii are performed until the predefined pattern is matched perfectly with the content of the search window.

6. The method of claim 4, wherein the steps i, ii and iii are performed until the predefined pattern is matched with the content of the search window except for a limited number of unmatched bits.

7. The method of claim 1, wherein the method is applied to the preamble of a GPON burst.

8. The method of claim 1, wherein the SFD as the form of a repetitive pattern.

9. A circuit for aligning a serial bit stream with a parallel output, comprising:
a latch for latching Q bits from the serial bit stream into a register;
a fault tolerant analysis logic (FTAL) for locating a position P of a first bit of a start of frame delimiter (SFD) in the register; and
a shift register for discarding P-1 bits from the serial bit stream, before the position of the first bit of the SFD, thereby aligning the serial bit stream with the parallel output.

10. The circuit of claim 9, wherein the FTAL comprises:
a concatenation register for holding a previous content of the register and for receiving a current content of the register;
a demultiplexed register for receiving every other at least one bit of the concatenation register; and
a position detection circuit for searching for a predefined pattern in the demultiplexed register, for identifying the position P of the first bit of the SFD, said pattern being generated by a subset of the SFD copied in the secondary register.

11. The circuit of claim 10, wherein the position detection circuit identifies the position P by perfectly matching the predefined pattern with the content of the search window.

12. The circuit of claim 10, wherein the position detection circuit identifies the position P by matching the predefined pattern with the content of the search window except for a limited number of unmatched bits.

* * * * *

UNITED STATES PATENT AND TRADEMARK OFFICE
CERTIFICATE OF CORRECTION

| | | |
|---|---|---|
| PATENT NO. | : 7,876,244 B2 | Page 1 of 1 |
| APPLICATION NO. | : 12/475250 | |
| DATED | : January 25, 2011 | |
| INVENTOR(S) | : Brunner et al. | |

It is certified that error appears in the above-identified patent and that said Letters Patent is hereby corrected as shown below:

In Fig. 2, Sheet 2 of 7, in Row 3, delete "lach" and insert -- latch --, therefor.

In Fig. 6, Sheet 7 of 7, in Line 6, delete "(UU_Position)" and insert -- (UU_Position)) --, therefor.

In Column 2, Line 21, delete "FIG. 3a-f" and insert -- FIGS. 3a-f --, therefor.

In Column 7, Line 22, delete "Waiting" and insert -- waiting --, therefor.

Signed and Sealed this
Nineteenth Day of April, 2011

David J. Kappos
*Director of the United States Patent and Trademark Office*